(12) United States Patent
Chidambarrao et al.

(10) Patent No.: US 7,462,522 B2
(45) Date of Patent: Dec. 9, 2008

(54) METHOD AND STRUCTURE FOR IMPROVING DEVICE PERFORMANCE VARIATION IN DUAL STRESS LINER TECHNOLOGY

(75) Inventors: Dureseti Chidambarrao, Weston, CT (US); Brian J. Greene, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 255 days.

(21) Appl. No.: 11/468,402

(22) Filed: Aug. 30, 2006

(65) Prior Publication Data

US 2008/0057653 A1  Mar. 6, 2008

(51) Int. Cl.
H01L 21/338 (2006.01)
H01L 29/82 (2006.01)

(52) U.S. Cl. ...................... 438/183; 257/418
(58) Field of Classification Search ............ 438/52, 438/902, 158, 183; 257/254, 418
See application file for complete search history.

(56) References Cited

U.S. PATENT DOCUMENTS

| | | | |
|---|---|---|---|
| 3,602,841 | A | 8/1971 | McGroddy |
| 4,665,415 | A | 5/1987 | Esaki et al. |
| 4,853,076 | A | 8/1989 | Tsaur et al. |
| 4,855,245 | A | 8/1989 | Neppl et al. |
| 4,952,524 | A | 8/1990 | Lee et al. |
| 4,958,213 | A | 9/1990 | Eklund et al. |
| 5,006,913 | A | 4/1991 | Sugahara et al. |
| 5,060,030 | A | 10/1991 | Hoke et al. |
| 5,081,513 | A | 1/1992 | Jackson et al. |
| 5,108,843 | A | 4/1992 | Ohtaka et al. |
| 5,134,085 | A | 7/1992 | Gilgen et al. |
| 5,310,446 | A | 5/1994 | Konishi et al. |
| 5,354,695 | A | 10/1994 | Leedy |
| 5,371,399 | A | 12/1994 | Burroughes et al. |
| 5,391,510 | A | 2/1995 | Hsu et al. |

(Continued)

FOREIGN PATENT DOCUMENTS

JP  64-76755  3/1989

OTHER PUBLICATIONS

Kern Rim, et al., "Transconductance Enhancement in Deep Submicron Strained-Si n-MOSFETs", International Electron Devices Meeting, 26, 8, 1, IEEE, Sep. 1998.

(Continued)

Primary Examiner—Calvin Lee
(74) Attorney, Agent, or Firm—Scully, Scott, Murphy & Presser, P.C.; Joseph P. Abate, Esq.

(57) ABSTRACT

A method for making a semiconductor structure that overcome the dual stress liner boundary problem, without significantly increasing the overall size of the integrated circuit, is provided. In accordance with embodiments of the present invention, the dual stress liner boundary or gap therebetween is forced to land on a neighboring dummy gate region. By forcing the dual stress liner boundary or gap between the liners to land on the dummy gate region, the large stresses associated with the dual stress liner boundary or gap are transferred to the dummy gate region, not the semiconductor substrate. Thus, the impact of the dual stress liner boundary on the nearest neighboring FET is reduced. Additionally, benefits of device variability and packing density are achieved utilizing the present invention.

1 Claim, 8 Drawing Sheets

U.S. PATENT DOCUMENTS

| | | | |
|---|---|---|---|
| 5,459,346 | A | 10/1995 | Asakawa et al. |
| 5,471,948 | A | 12/1995 | Burroughes et al. |
| 5,557,122 | A | 9/1996 | Shrivastava et al. |
| 5,561,302 | A | 10/1996 | Candelaria |
| 5,565,697 | A | 10/1996 | Asakawa et al. |
| 5,571,741 | A | 11/1996 | Leedy |
| 5,592,007 | A | 1/1997 | Leedy |
| 5,592,018 | A | 1/1997 | Leedy |
| 5,670,798 | A | 9/1997 | Schetzina |
| 5,679,965 | A | 10/1997 | Schetzina |
| 5,683,934 | A | 11/1997 | Candelaria |
| 5,840,593 | A | 11/1998 | Leedy |
| 5,861,651 | A | 1/1999 | Brasen et al. |
| 5,880,040 | A | 3/1999 | Sun et al. |
| 5,940,716 | A | 8/1999 | Jin et al. |
| 5,940,736 | A | 8/1999 | Brady et al. |
| 5,946,559 | A | 8/1999 | Leedy |
| 5,960,297 | A | 9/1999 | Saki |
| 5,989,978 | A | 11/1999 | Peidous |
| 6,008,126 | A | 12/1999 | Leedy |
| 6,025,280 | A | 2/2000 | Brady et al. |
| 6,046,464 | A | 4/2000 | Schetzina |
| 6,066,545 | A | 5/2000 | Doshi et al. |
| 6,090,684 | A | 7/2000 | Ishitsuka et al. |
| 6,107,143 | A | 8/2000 | Park et al. |
| 6,117,722 | A | 9/2000 | Wuu et al. |
| 6,133,071 | A | 10/2000 | Nagai |
| 6,165,383 | A | 12/2000 | Chou |
| 6,221,735 | B1 | 4/2001 | Manley et al. |
| 6,228,694 | B1 | 5/2001 | Doyle et al. |
| 6,246,095 | B1 | 6/2001 | Brady et al. |
| 6,255,169 | B1 | 7/2001 | Li et al. |
| 6,261,964 | B1 | 7/2001 | Wu et al. |
| 6,265,317 | B1 | 7/2001 | Chiu et al. |
| 6,274,444 | B1 | 8/2001 | Wang |
| 6,281,532 | B1 | 8/2001 | Doyle et al. |
| 6,284,623 | B1 | 9/2001 | Zhang et al. |
| 6,284,626 | B1 | 9/2001 | Kim |
| 6,319,794 | B1 | 11/2001 | Akatsu et al. |
| 6,361,885 | B1 | 3/2002 | Chou |
| 6,362,082 | B1 | 3/2002 | Doyle et al. |
| 6,368,931 | B1 | 4/2002 | Kuhn et al. |
| 6,403,486 | B1 | 6/2002 | Lou |
| 6,403,975 | B1 | 6/2002 | Brunner et al. |
| 6,406,973 | B1 | 6/2002 | Lee |
| 6,461,936 | B1 | 10/2002 | von Ehrenwall |
| 6,476,462 | B2 | 11/2002 | Shimizu et al. |
| 6,483,171 | B1 | 11/2002 | Forbes et al. |
| 6,493,497 | B1 | 12/2002 | Ramdani et al. |
| 6,498,358 | B1 | 12/2002 | Lach et al. |
| 6,501,121 | B1 | 12/2002 | Yu et al. |
| 6,506,652 | B2 | 1/2003 | Jan et al. |
| 6,509,618 | B2 | 1/2003 | Jan et al. |
| 6,521,964 | B1 | 2/2003 | Jan et al. |
| 6,531,369 | B1 | 3/2003 | Ozkan et al. |
| 6,531,740 | B2 | 3/2003 | Bosco et al. |
| 6,621,392 | B1 | 9/2003 | Volant et al. |
| 6,635,506 | B2 | 10/2003 | Volant et al. |
| 6,653,678 | B2 | 11/2003 | Chidambarrao et al. |
| 6,717,216 | B1 | 4/2004 | Doris et al. |
| 6,825,529 | B2 | 11/2004 | Chidambarrao et al. |
| 6,831,292 | B2 | 12/2004 | Currie et al. |
| 6,869,866 | B1 | 3/2005 | Chidambarrao et al. |
| 6,872,620 | B2 | 3/2005 | Chidambarrao et al. |
| 6,887,751 | B2 | 5/2005 | Chidambarrao et al. |
| 6,890,808 | B2 | 5/2005 | Chidambarrao et al. |
| 6,974,981 | B2 | 12/2005 | Chidambarrao et al. |
| 6,977,194 | B2 | 12/2005 | Belyansky et al. |
| 7,015,082 | B2 | 3/2006 | Doris et al. |
| 7,052,946 | B2 * | 5/2006 | Chen et al. ................. 438/199 |
| 2001/0004122 | A1 | 6/2001 | Ito |
| 2001/0009784 | A1 | 7/2001 | Ma et al. |
| 2002/0063292 | A1 | 5/2002 | Armstrong et al. |
| 2002/0074598 | A1 | 6/2002 | Doyle et al. |
| 2002/0086472 | A1 | 7/2002 | Roberds et al. |
| 2002/0086497 | A1 | 7/2002 | Kwok |
| 2002/0090791 | A1 | 7/2002 | Doyle et al. |
| 2003/0013259 | A1 | 1/2003 | Chidambarrao et al. |
| 2003/0032261 | A1 | 2/2003 | Yeh et al. |
| 2003/0040158 | A1 | 2/2003 | Saitoh |
| 2003/0057184 | A1 | 3/2003 | Yu et al. |
| 2003/0067035 | A1 | 4/2003 | Tews et al. |
| 2003/0201480 | A1 | 10/2003 | Chidambarrao et al. |
| 2004/0029323 | A1 * | 2/2004 | Shimizu et al. ............. 438/142 |
| 2004/0113174 | A1 | 6/2004 | Chidambarrao et al. |
| 2004/0113217 | A1 | 6/2004 | Chidambarrao et al. |
| 2004/0238914 | A1 | 12/2004 | Deshpande et al. |
| 2004/0262784 | A1 | 12/2004 | Doris et al. |
| 2005/0040460 | A1 | 2/2005 | Chidambarrao et al. |
| 2005/0054148 | A1 | 3/2005 | Chidambarrao et al. |
| 2005/0059201 | A1 | 3/2005 | Chidambarrao et al. |
| 2005/0064646 | A1 | 3/2005 | Chidambarrao et al. |
| 2005/0064687 | A1 | 3/2005 | Chidambarrao et al. |
| 2005/0082616 | A1 | 4/2005 | Chen et al. |
| 2005/0082634 | A1 | 4/2005 | Doris et al. |
| 2005/0085022 | A1 | 4/2005 | Chidambarrao et al. |
| 2005/0093030 | A1 | 5/2005 | Doris et al. |
| 2005/0093059 | A1 | 5/2005 | Belyansky et al. |
| 2005/0098829 | A1 | 5/2005 | Doris et al. |
| 2005/0104131 | A1 | 5/2005 | Chidambarrao et al. |
| 2005/0106799 | A1 | 5/2005 | Doris et al. |
| 2005/0130358 | A1 | 6/2005 | Chidambarrao et al. |
| 2005/0139930 | A1 | 6/2005 | Chidambarrao et al. |
| 2005/0142788 | A1 | 6/2005 | Chidambarrao et al. |
| 2005/0145950 | A1 | 7/2005 | Chidambarrao et al. |
| 2005/0145954 | A1 | 7/2005 | Zhu et al. |
| 2005/0148146 | A1 | 7/2005 | Doris et al. |
| 2005/0194699 | A1 | 9/2005 | Belyansky et al. |
| 2005/0236668 | A1 | 10/2005 | Zhu et al. |
| 2005/0245017 | A1 | 11/2005 | Belyansky et al. |
| 2005/0258515 | A1 | 11/2005 | Chidambarrao et al. |
| 2005/0260808 | A1 | 11/2005 | Xiangdong et al. |
| 2005/0269561 | A1 | 12/2005 | Chidambarrao et al. |
| 2005/0280051 | A1 | 12/2005 | Chidambarrao et al. |
| 2005/0282325 | A1 | 12/2005 | Belyansky et al. |
| 2005/0285137 | A1 | 12/2005 | Satoh |
| 2006/0027868 | A1 | 2/2006 | Doris et al. |
| 2006/0046400 | A1 | 3/2006 | Burbach et al. |
| 2006/0057787 | A1 | 3/2006 | Doris et al. |
| 2006/0060925 | A1 | 3/2006 | Doris et al. |
| 2006/0094193 | A1 | 5/2006 | Horstmann et al. |
| 2007/0246741 | A1 * | 10/2007 | Sudo ........................ 257/178 |
| 2007/0252230 | A1 | 11/2007 | Zhu et al. |

OTHER PUBLICATIONS

Kern Rim, et al., "Characteristics and Device Design of Sub-100 nm Strained Si N- and PMOSFETs." 2002 Symposium on VLSI Technology Digest of Technical Papers, IEEE, pp. 98-99.

Gregory Scott, et al., "NMOS Drive Current Reduction Caused by Transistor Layout and Trench Isolation Induced Stress." International Electron Devices Meeting, 34.4.1, IEEE, Sep. 1999.

F. Ootsuka, et al., "A Highly Dense, High-Performance 130nm Node CMOS Technology for Large Scale System-on-a-Chip Application." International Electron Devices Meeting, 23.5.1, IEEE, Apr. 2000.

Shinya Ito, et al., "Mechanical Stress Effect of Etch-Step Nitride and its Impact on Deep Submicron Transistor Design." International Electron Devices Meeting, 10.7.1, IEEE, Apr. 2000.

A. Shimizu, et al., "Local Mechanical-Stress Control (LMC): A New Technique for CMOS-Performance Enhancement." International Electron Devices Meeting, IEEE, Mar. 2001.

K. Ota, et al., "Novel Locally Strained Channel Technique for High Performance 55nm CMOS." International Electron Devices Meeting, 2.2.1, IEEE, Feb. 2002.

G. Zhang, et al., "A New 'Mixed-Mode' Reliability Degradation Mechanism in Advanced Si and SiGe Bipolar Transistors." IEEE Transactions on Electron Devices, vol. 49, No. 12, Dec. 2002, pp. 2151-2156.

H.S. Momose, et al., "Temperature Dependence of Emitter-Base Reverse Stress Degradation and Its Mechanism Analyzed by MOS Structures." Paper 6.2, pp. 140-143.

C.J. Huang, et al., "Temperature Dependence and Post-Stress Recovery of Hot Electron Degradation Effects in Bipolar Transistors." IEEE 1991 Bipolar Circuits and Technology Meeting 7.5, pp. 170-173.

S.R. Sheng, et al., "Degradation and Recovery of SiGe HBTs Following Radiation and Hot-Carrier Stressing." pp. 14-15.

Z. Yang, et al., "Avalanche Current Induced Hot Carrier Degradation in 200 Gitz SiGe Heterojunction Bipolar Transistors." pp. 1-5.

H. Li, et al., "Design of W-Band VCOs with High Output Power for Potential Application in 77 GHz Automotive Radar Systems." 2003 IEEE GaAs Digest, pp. 263-266.

H. Wurzer, et al., "Annealing of Degraded npn-Transistors-Mechanisms and Modeling." IEEE Transactions on Electron Devices, vol. 41, No. 4, Apr. 1994, pp. 533-538.

B. Doyle, et al., "Recovery of Hot-Carrier Damage in Reoxidized Nitrided Oxide MOSFETs." IEEE Electron Device Letters, vol. 13, No. 1, Jan. 1992, pp. 38-40.

H.S. Momose, et al., "Analysis of the Temperature Dependence of Hot-Carrier-Induced Degradation In Bipolar Transistors for BI-CMOS." IEEE Transactions on Electron Devices, vol. 41, No. 6, Jun. 1994, pp. 978-987.

M. Khater, et al., "SiGe HBT Technology with Fmax/Ft=350/300 GHs and Gate Delay Below 3.3 ps". 2004 IEEE, 4 pages.

J.C. Bean, et al., "GEx SI 1-x/Si Strained-Layer Superlattice Grown by Molecular Beam Epitaxy". J. Vac. Sci. Technol. A 2(2), Apr.-Jun. 1984, pp. 436-440.

J.H. Van Der Merve, "Regular Articles". Journal of Applied Physics, vol. 34, No. 1, Jan. 1963, pp. 117-122.

J.W. Matthews, et al., "Defects in Epitaxial Multilayers". Journal of Crystal Growth 27 (1974), pp. 118-125.

Subramanian S. Iyer, et al., "Heterojunction Bipolar Transistors Using Si-Ge Alloys". IEEE Transactions on Electron Devices, vol. 36, No. 10, Oct. 1989, pp. 2043-2064.

R.H.M. Van De Leur, et al., "Critical Thickness for Pseudomorphic Growth of Si/Ge Alloys and Superlattices". J. Appl. Phys. 64 (6), Sep. 15, 1988, pp. 3043-3050.

D.C. Houghton, et al., "Equilibrium Critical Thickness for SI 1-x GEx Strained Layers on (100) Si". Appl. Phys. Lett. 56 (5), Jan. 29, 1990, pp. 460-462.

Q. Ouyang et al., "Two-Dimensional Bandgap Engineering in a Novel Si/SiGe pMOSFET with Enhanced Device Performance and Scalability". 2000 IEEE, pp. 151-154.

Sheraw, C.D. et al., "Dual stress liner enhancement in hybrid orientation technology," VLSI Technology, 2005, Digest of Technical Papers, 2005 Symposium on Kyoto, Japan, Jun. 14-16, 2005, Piscataway, NJ, USA, IEEE, Jun. 14, 2005, pp. 12-13, XP010818152, ISBN: 4-900784-00-1.

Yang, H.S. et al., "Dual stress liner for high performance sub-45nm gate length SOI CMOS manufacturing," Electron Devices Meeting, 2004, IEDM Technical Digest, IEEE International San Francisco, CA, USA Dec. 13-15, 2004, Piscataway, NJ, USA, IEEE, Dec. 13, 2004, pp. 1075-1077, XP010789003, ISBN: 0-7803-8684-1.

* cited by examiner

METHOD AND STRUCTURE FOR IMPROVING DEVICE PERFORMANCE VARIATION IN DUAL STRESS LINER TECHNOLOGY

FIELD OF THE INVENTION

The present invention relates to a semiconductor structure and a method of fabricating the same. More particularly, the present invention relates to a complementary metal oxide semiconductor (CMOS) structure that has improved device performance, which is obtained by using a modified dual stress liner technology. The present invention also provides a method of fabricating such a CMOS structure using the modified dual stress liner technology.

BACKGROUND OF THE INVENTION

For more than three decades, the continued miniaturization of silicon metal oxide semiconductor field effect transistors (MOSFETs) has driven the worldwide semiconductor industry. Various showstoppers to continued scaling have been predicated for decades, but a history of innovation has sustained Moore's Law in spite of many challenges. However, there are growing signs today that metal oxide semiconductor transistors are beginning to reach their traditional scaling limits.

Since it has become increasingly difficult to improve MOSFETs and therefore CMOS performance through continued scaling, methods for improving performance without scaling have become critical. One approach for doing this is to increase carrier (electron and/or hole) mobilities. Increased carrier mobility can be obtained, for example, by introducing the appropriate stress/strain into the semiconductor lattice.

The application of stress changes the lattice dimensions of the semiconductor substrate. By changing the lattice dimensions, the electronic band structure of the material is changed as well. This results in changes in carrier transport properties such as carrier scattering rates and effective mass, which can be dramatic in certain cases. The application of physical stress (tensile or compressive) can be further used to enhance the performance of devices fabricated on the semiconductor substrates.

Compressive strain along the device channel increases drive current in p-type field effect transistors (pFETs) and decreases drive current in n-type field effect transistors (nFETs). Tensile strain along the device channel increases drive current in nFETs and decreases drive current in pFETs.

Stress can be introduced into a single crystal oriented substrate by several methods including, for example, forming a stress liner on top of the substrate and around the gate region. Depending on the conductivity type of the FET (i.e., p or n), the stress liner is optimally under tensile stress (preferred for nFETs) or compressive stress (preferred for pFETs). When nFETs and pFETs are integrated onto the same semiconductor substrate, dual stress liner technology is typically used in which a first stress liner under tensile stress is formed around each nFET, while a second stress liner under compressive stress is formed around each pFET. It is noted that the order of forming the stress liners may be variable. For example, the compressive stress liner may be formed prior to the tensile stress liner or visa versa.

However, the boundary between tensile and compressive stress liners in dual stress liner (DSL) technology also induces stress in the substrate, which can influence transistor performance as well. When the DSL boundary is in close proximity (with a lateral distance of about 5 microns or less) from an FET, and oriented parallel to the gate region, a degradation of the devices in proximity to the boundary has been observed. Degradation of 25% pFET and 18% nFET (saturation current at a fixed overdrive) have been demonstrated on recent CMOS structures, which is solely attributed to the DSL boundary influence mentioned above.

Figure 1A:
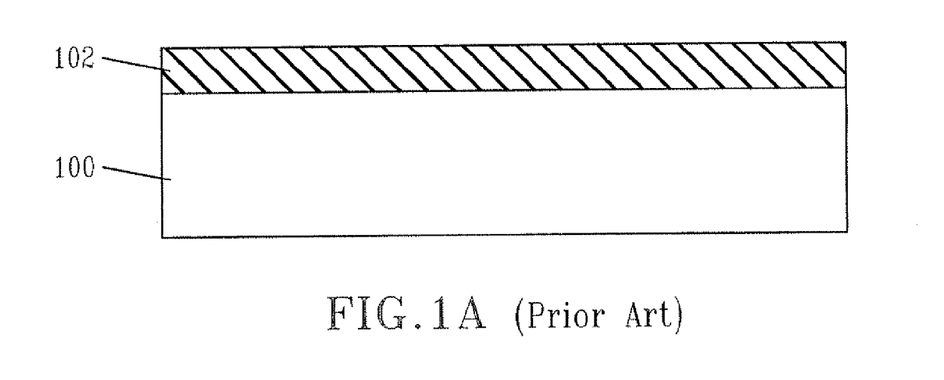
FIGS. 1A-1D are pictorial representations (through cross sectional views) depicting prior art dual stress liner technology.

Reference is now made to FIGS. 1A-1D which illustrates the DSL boundary influence in greater detail for the case in which the tensile stress liner is formed prior to the formation of the compressive stress liner; in this case the compressive stress liner overlaps a portion of the tensile stress liner. FIG. 1A illustrates a portion of a non-stressed semiconductor substrate 100 that has a tensile stress liner 102 formed on a surface thereof. It is noted that no FET structures are shown in FIG. 1A since they lay to the periphery of the portion of the substrate 100 shown in FIG. 1A. The FETs are formed prior to disposing the tensile stress liner 102 on the substrate.

Figure 1B:
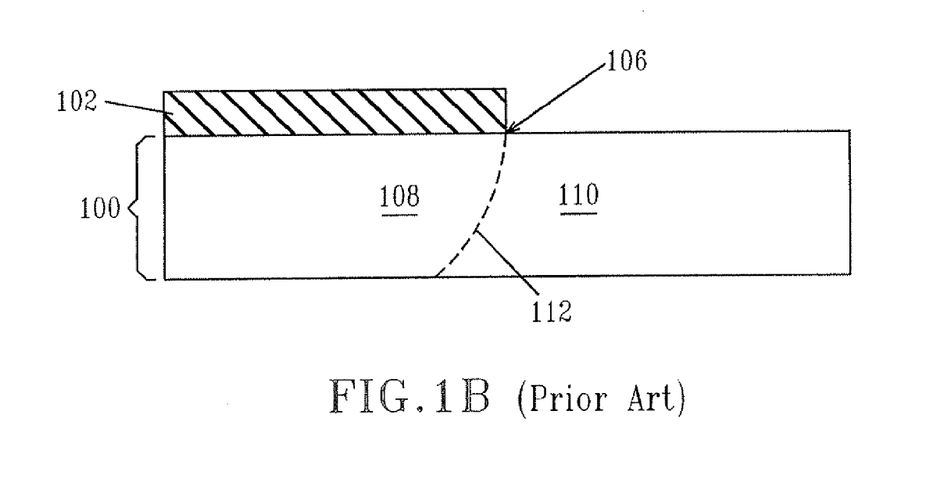

FIG. 1B illustrates the structure of FIG. 1A after patterning the tensile stress liner 102 by lithography and etching. As shown, an edge force 106 is created on the substrate 100. Moreover, the tensile stress liner 102 creates local stress in the substrate that decays with distance from the etched edge of the liner 102. In FIG. 1B, reference numeral 108 denotes a region of the substrate 100 under compression, while reference numeral 110 denotes a region of the substrate under tension. The dotted line (designated as 112) denotes a zero stress line.

Figure 1C:
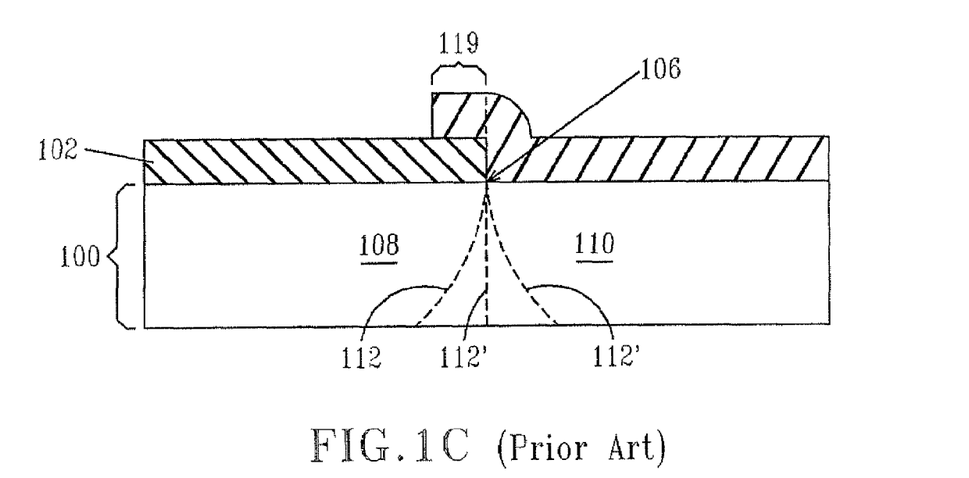

FIG. 1C illustrates the structure of FIG. 1B after forming a compressive stress liner 114 thereon. The overlap region (i.e., boundary) 119 of the dual liners magnifies the edge force 106. Depending on the relative strengths of the tensile and compressive liners, the zero stress contour can take the form of 112, or either of the two other contours indicated by 112'.

Figure 1D:
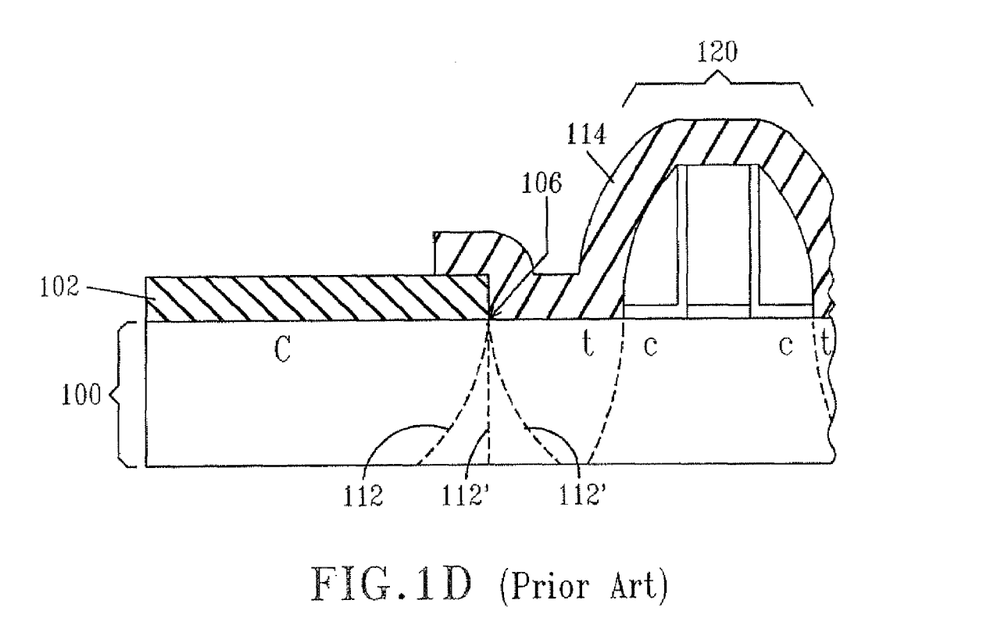

FIG. 1D is an expanded view of FIG. 1C showing the presence of an FET 120 on a surface of the substrate 100. In this drawing, the substrate is under the following stresses (i) compression (c) under the FET 120 (from left spacer outer edge to right spacer outer edge), (ii) tension (t) beneath the compressive liner 114, and (iii) compression (c) under the tensile liner 102.

The problem with such a structure is that the dual stress liner boundary 119 is in longitudinal proximity to the FET 120 which results in substantial degradation of the performance of the FET. The term "longitudinal proximity" is used in the present application to denote that the dual stress liner boundary 119 is located at a distance lengthwise from the FET that is about 5 microns or less. This degradation is observed for both nFETs and pFETs. In particular, it was been found that the longitudinal stress, which is related to the dual stress liner boundary 119, reduces the stress in the FET channel.

One solution to this dual stress liner boundary problem is to design an integrated circuit in which the longitudinal boundaries are placed far away (a longitudinal distance of greater than 5 microns) from the FET devices. Although such a solution is feasible, it does come with an area penalty that increases the overall size of the integrated circuit. Such an increase in size contradicts the current trend in shrinking integrated circuits.

As such, a method is needed which overcomes the dual stress liner boundary problem without significantly increasing the overall size of the integrated circuit.

SUMMARY OF THE INVENTION

The present invention provides a method and semiconductor structure that overcomes the dual stress liner boundary problem, without significantly increasing the overall size of the integrated circuit. In accordance with a first embodiment of the present invention, the dual stress liner boundary or gap is forced to land on a neighboring dummy gate region. By forcing the dual stress liner boundary or gap to land on the neighboring dummy gate region, the large stresses associated with the dual stress liner boundary are transferred to the dummy gate material, not the semiconductor substrate. The dummy gate region may be located within an active area of the FET or it may be present atop an isolation region such as a trench isolation region. Thus, the impact of the dual stress liner boundary on the nearest neighboring FET is reduced. Additionally, benefits of device variability and packing density are achieved utilizing the present invention.

Embodiments of the present invention provides a method of fabricating a semiconductor structure In general terms, one embodiment of the method includes:

providing a semiconductor substrate having at least one dummy gate region in proximity to at least one active gate region; and disposing, in any order, a tensile stress liner and a compressive stress liner on the substrate, wherein the tensile stress liner and the compressive stress liner are present at least in part over the dummy gate region such that a boundary or gap between the stress liners lands on top of the dummy gate region.

In addition to using dual stress liners, the present application can also be applied to a semiconductor structure in which a single stress liner is present. In such an instance, the etched edge of the single stress liner is forced to land atop the dummy gate region of the structure.

DETAILED DESCRIPTION OF THE INVENTION

The present invention which provides a method and structure for improving device performance utilizing a variation in the conventional dual stress liner technology, will now be described in greater detail by referring to the following discussion and drawings that accompany the present application. It is noted that the drawings of the present application are provided for illustrative purposes and, as such, they are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

The present invention provides a method and structure in which a modified dual stress liner process is employed. The modified dual stress liner process of the present invention forces the dual stress liner boundary or gap to land on a dummy gate region that is in close proximity to an active gate region. By "dummy gate region", it is meant a non-active gate region that is typically not a functional transistor, and is typically formed to minimize the variability of nearby active gates. The term "active gate region" denotes a functional transistor gate. By close proximity" it is meant that the boundary between the dual stress liners is from about 5 microns or less from the active gate region.

Figure 2A:
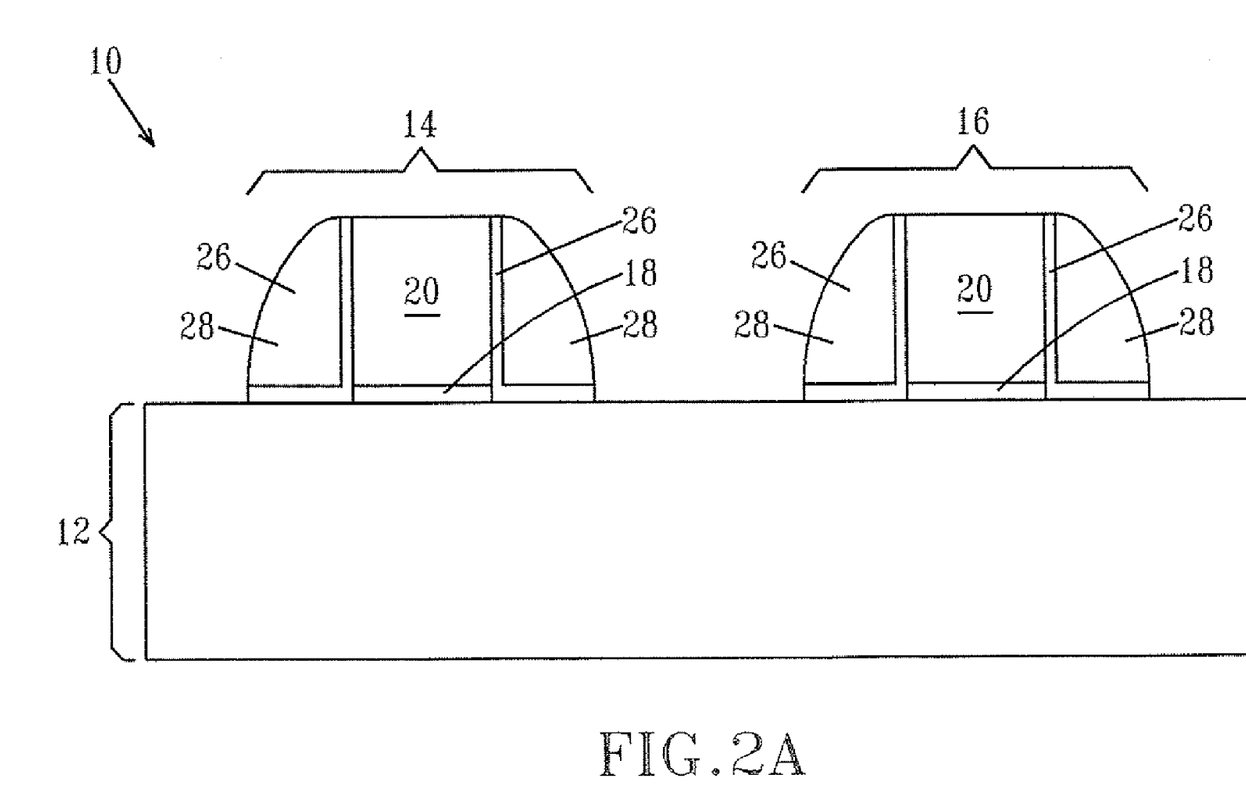
FIGS. 2A-2C are pictorial representations (through cross sectional views) depicting the modified dual stress liner technology provided by the present invention.

Reference is first made to FIG. 2A which illustrates an initial structure 10 that is employed in the present invention. As shown, the initial structure 10 includes a semiconductor substrate 12 having at least one dummy gate region 14 and at least one active gate region 16 in close proximity to each other. In accordance with the present invention, the dummy gate region 14 may be located atop an active region of the substrate as is shown in this drawing, or alternatively, the dummy gate may be located atop an isolation region present within or on the substrate.

The at least one active gate region 16 may be an nFET or a pFET. Combinations of pFETs and nFETs are also contemplated in the present invention.

Each dummy gate region 14 and each active gate 16 present on the substrate 12 includes a gate dielectric 18 located on a surface of the substrate 12 and a gate electrode 20 located on the gate dielectric 20. Each active gate region 16 includes a channel region (not shown) located within the substrate 12 and beneath the gate dielectric/gate electrode stack. Source/drain regions (not shown) are located adjacent to the channel region in each of the active gate regions. Each dummy gate region 14 and active gate region 16 may also include at least one sidewall spacer. In FIG. 1A, a pair of sidewall spacers including an inner L-shaped spacer 26 and an outer spacer 28 is shown. The at least one sidewall spacer is optional, and need not be used in all instances.

The at least one dummy gate region 14 and the at least one active gate region 16 are fabricated using conventional complementary metal oxide semiconductor processing techniques well known to those skilled in the art. For example, deposition of various material layers, lithography, etching, ion implantation and annealing can be used in forming the active gate regions. The same processing steps can be used in forming the at least one dummy gate region 14. Each gate region (active and non-active) can also be formed utilizing a replacement gate process.

The semiconductor substrate 12 includes any semiconductor material including, for example, Si, SiC, SiGeC, Ge, SiGe, Ga, GaAs, InAs, InP as well as other III/V or II/VI compound semiconductors. Layered semiconductors such as, for example, Si/SiGe and semiconductor-on-insulators (SOIs) are also contemplated herein. Typically, the semiconductor substrate 12 is a Si-containing semiconductor such as, for example, Si, SiC, SiGe, SiGeC, or a silicon-on-insulator. The substrate 12 may be unstrained, strained or include regions of strain and unstrain therein. The substrate 12 may be intrinsic or it may be doped with, for example, but not limited to: B, As or P.

When SOI substrates are employed, those substrates include top and bottom semiconductor, e.g., Si, layers that are separated at least in part by a buried insulating layer. The buried insulating layer includes, for example, a crystalline or non-crystalline oxide, nitride or any combination thereof. Preferably, the buried insulating layer is an oxide. Typically, the buried insulating layer is formed during initial stages of a layer transfer process or during an ion implantation and annealing process, such as, for example, SIMOX (separation by ion implantation of oxygen).

The substrate 12 may have a single crystal orientation or alternatively hybrid semiconductor substrates having surface regions of different crystal orientations can also be employed. The hybrid substrate allows for fabricating a FET upon a specific crystal orientation that enhances the performance of each FET formed. For example, the hybrid substrate allows for providing a structure in which a pFET can be formed on a (110) crystal orientation, while the nFET can be formed on a (100) crystal orientation. When a hybrid substrate is used, it may have SOI-like properties, bulk-like properties or a combination of SOI- and bulk-like properties.

In some embodiments of the present invention, at least one isolation region (not shown) is formed into the substrate 12. The at least one isolation region may include a trench isolation region, a field oxide isolation region or combinations thereof. The isolation regions are formed utilizing processing techniques well known to those skilled in the art.

The gate dielectric 18 present in each of the gate regions can comprise the same or different insulating material. For example, the gate dielectric 18 can be comprised of an oxide, nitride, oxynitride, high k material (i.e., a dielectric material having a dielectric constant that is greater than silicon dioxide) or any combination thereof including multilayers. Preferably, the gate dielectric 18 is comprised of an oxide such as, for example, $SiO_2$.

The gate electrode 20 of each of the gate regions (active and dummy) can be comprised of the same or different conductive material, including, for example, polySi, SiGe, a metal, a metal alloy, a metal silicide, a metal nitride or combinations including multilayers thereof. When multilayers are present, a diffusion barrier (not shown), such as TiN or TaN, can be positioned between each of the conductive layers. A capping layer (also not shown), such as an oxide, or nitride, can be located atop the gate electrode of each of the gate regions the presence of the capping layer can be used to prevent subsequent formation of a silicide contact on said gate electrode. The silicide contact on said gate electrode is typically formed when the gate electrode includes a Si-containing material and no capping layer is present. Preferably, the gate electrode within each of the gate regions comprises polySi or polySiGe.

The at least one spacer that is optionally present is typically comprised of an oxide, nitride or oxynitride including combinations and multilayers thereof. Although optional, typically one spacer is present in the inventive structure. In the illustrated example, a pair of spacers is shown. Typically, the inner L-shaped spacer 26 is comprised on an oxide, while the outer spacer 28 is comprised of a nitride.

As indicated above, each active gate region 16 also includes S/D regions which typically include extension regions and deep S/D diffusion regions. The source/drain regions together with the gate electrode 20 define the length of the channel in the active gate region 16. It is noted that S/D extensions and S/D diffusion regions are comprised of an upper portion of the semiconductor substrate 12 that has been doped with either n- or p-type dopants by ion implantation. The S/D extensions are typically shallower in depth than the S/D diffusion regions.

Figure 2B:
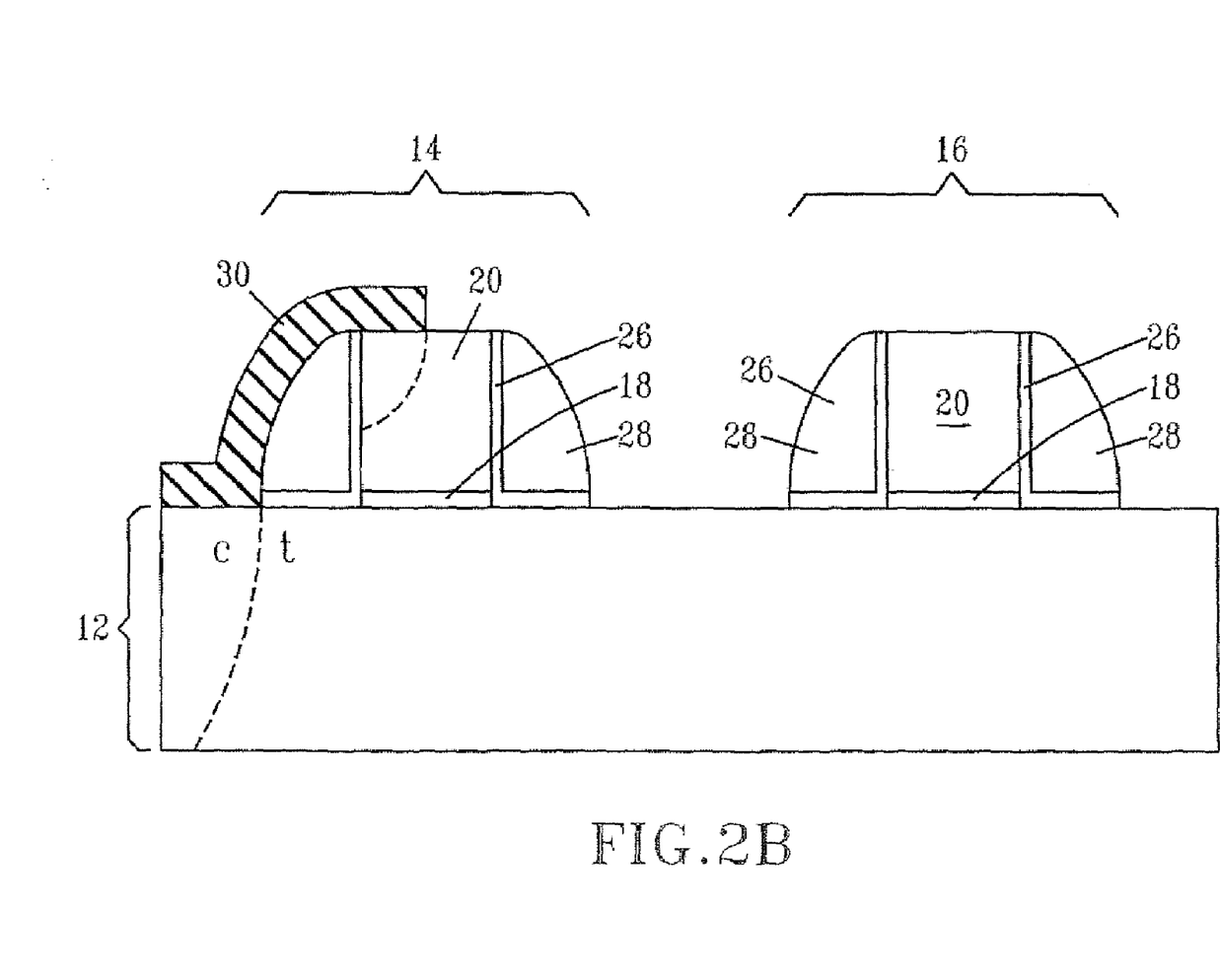

Next, and as shown in FIG. 2B, a first stress liner 30 is formed on a portion of the substrate 12 as well as covering a portion of the dummy gate region 14. The terms "first and second stress liner" are used throughout this application to denote stress inducing materials that have been deposited and patterned by lithography and etching. In accordance with the method of the present invention, the first stress liner may be a tensile stress liner or a compressive stress liner. In a preferred embodiment, and for the drawings illustrated in the present application, the first stress liner 30 is a tensile stress liner. This configuration assumes that the active gate region 16 is a pFET. A compressive stress liner would be used for the first stress liner 30 when the active gate region 16 is an nFET.

The presence of the stress liner results in stresses being introduced into the substrate 12. In the drawing, the lower case 't' denotes the tensile stress induced into the substrate by the presence of the tensile stress liner, while the lower case 'c' denotes the compressive stress induced by the presence of the tensile stress liner on the substrate 12. The dotted lines represent the zero stress lines present in the substrate. It is noted that when the first stress liner 30 is a compressive stress liner, the position of the lower case c and t would be reversed from that shown in FIG. 2B.

The first stress liner 30 is comprised of any stress inducing material such as a nitride or a high density plasma (HDP) oxide, or a combination thereof. The stress liner can formed by various chemical vapor deposition (CVD) processes such as low pressure CVD (LPCVD), plasma enhanced CVD (PECVD), rapid thermal CVD (RTCVD) or BTBAS-based ($C_8H_{22}N_2Si$ reacted with ammonia) CVD, where BTBAS is a modern metalorganic precursor for CVD application. The later process provides a low temperature nitride film having high stress. Following deposition of the stress liner material, lithography and etching are used in forming the first stress liner 30.

Preferably, the first stress liner 30 comprises a nitride, such as $Si_3N_4$, wherein the process conditions of the deposition process are selected to provide an intrinsic tensile strain within the deposited layer. For example, plasma enhanced chemical vapor deposition (PECVD) can provide nitride stress liners having an intrinsic tensile strain. The stress state (tensile or compressive) of the stress liners deposited by PECVD can be controlled by changing the deposition conditions to alter the reaction rate within the deposition chamber. More specifically, the stress state of a deposited nitride stress liner may be set by changing the deposition conditions such as: $SiH_4/N_2$/He gas flow rate, pressure, RF power, and electrode gap.

In another example, rapid thermal chemical vapor deposition (RTCVD) can provide nitride tensile stress liners having an internal tensile strain. The magnitude of the internal tensile strain produced within the nitride tensile stress liner deposited by RTCVD can be controlled by changing the deposition conditions. More specifically, the magnitude of the tensile strain within the nitride stress liner may be set by changing deposition conditions such as: precursor composition, precursor flow rate and temperature.

Figure 2C:
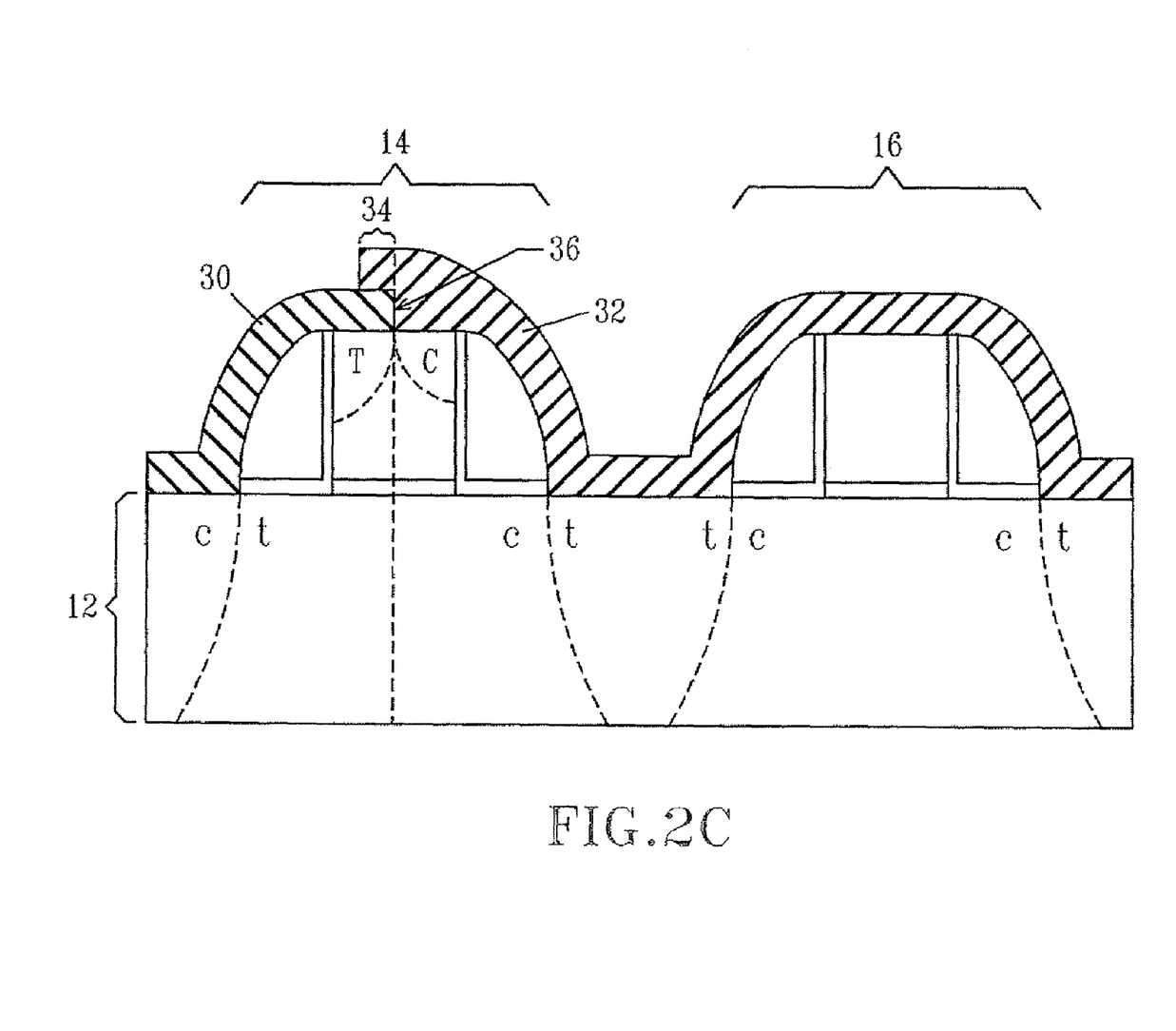

FIG. 2C illustrates the structure of FIG. 2B after a second stress liner 32 is formed thereon. In accordance with the present invention, the second stress liner 32 covers a portion of the substrate 12 and the entire active gate region 16 as well as a portion of the dummy gate region 14. As shown, the second stress liner 32 extends atop a small segment of the patterned stress liner 30 such that an overlap 34 of the first and second stress liners is created atop the dummy gate region 14. In one embodiment, a compressive stress liner overlaps a segment of the tensile stress liner atop the dummy gate region 14. In another embodiment, a tensile stress liner overlaps a segment of a compressive stress liner. Additional embodiments have compressive stress liner and tensile stress liner in close proximity (within approximately 200 nm), but not directly overlapping.

Due to the location of the overlap 34, the dual stress liner boundary (surfaces of the stress liners that abut each other but do not overlap) is present atop the dummy gate region 14 as is shown in FIG. 2C. The large stress forces (represented by upper case 'T' for tensile, and by upper case "C" for compressive) generated by the dual stress liner boundary 36 are located within the dummy gate region 14, not the substrate 12 as well the case with prior art dual stress liner technology. The dotted lines in the drawing again refer to the zero stress lines.

In accordance with the method of the present invention, the second stress liner 32 may be a tensile stress liner or a compressive stress liner with the proviso that it has opposite stress sign as compared to the first stress liner 30. In a preferred embodiment, and for the drawings illustrated in the present application, the second stress liner 32 is a compressive stress liner. This configuration assumes that the active gate region 16 is pFET. A tensile stress liner would be used when the active device region 16 is an nFET.

The presence of the second stress liner 32 results in stress being introduced into the substrate 12. In the drawing, the upper case 'C' denotes the compressive stress induced by the presence of the second compressive stress liner on the substrate 12. The dotted lines in the drawing again refer to the zero stress lines.

The second stress liner 32 is formed utilizing the same basic processing steps as the first stress liner 30. Hence, deposition, lithography and etching are used in forming the second stress liner 32. The second stress liner is comprised of the same or different stress inducing materials as mentioned above for the first stress liner 30.

Figure 3:
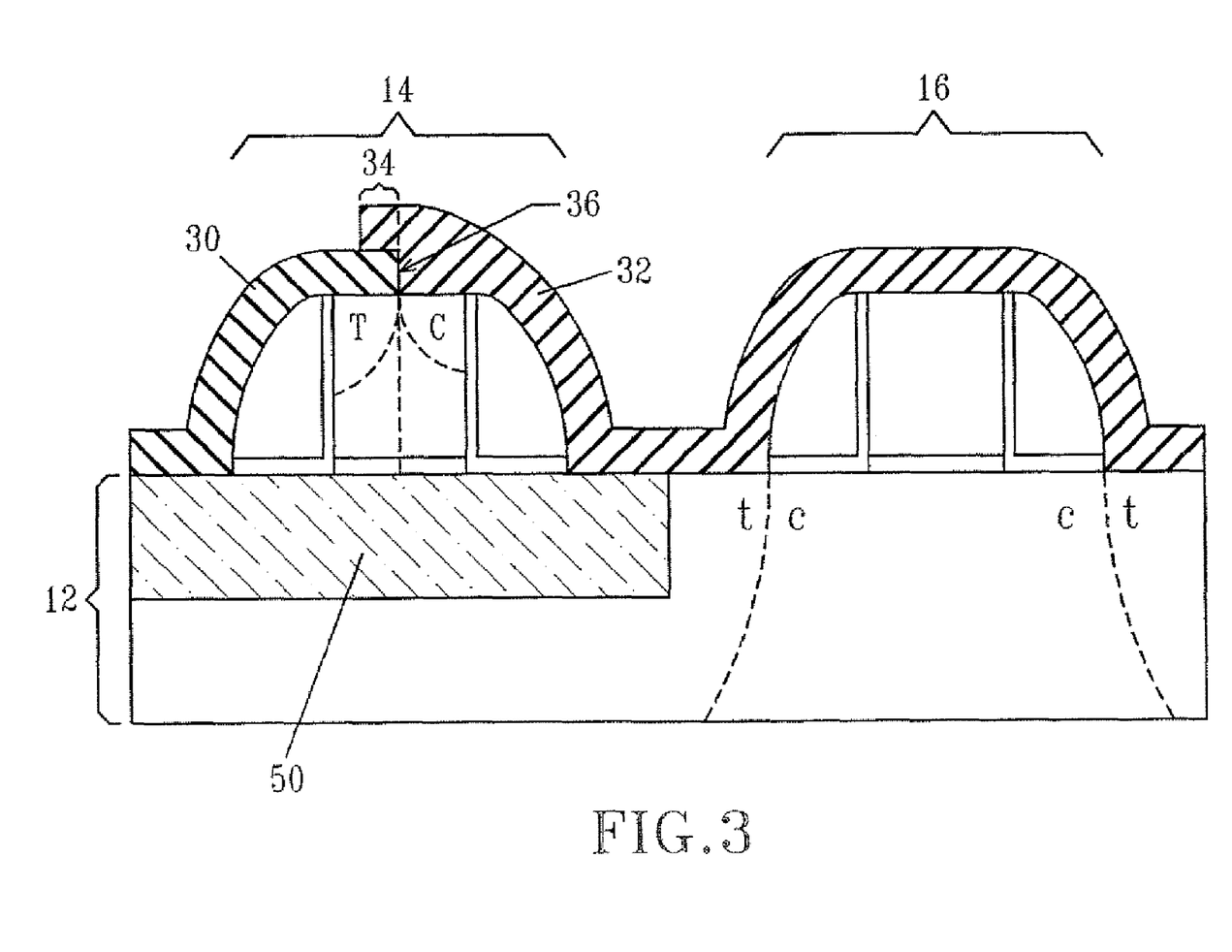
FIG. 3 is a pictorial representation (through a cross sectional view) depicting an alternative structure of the present application.
Figure 4:
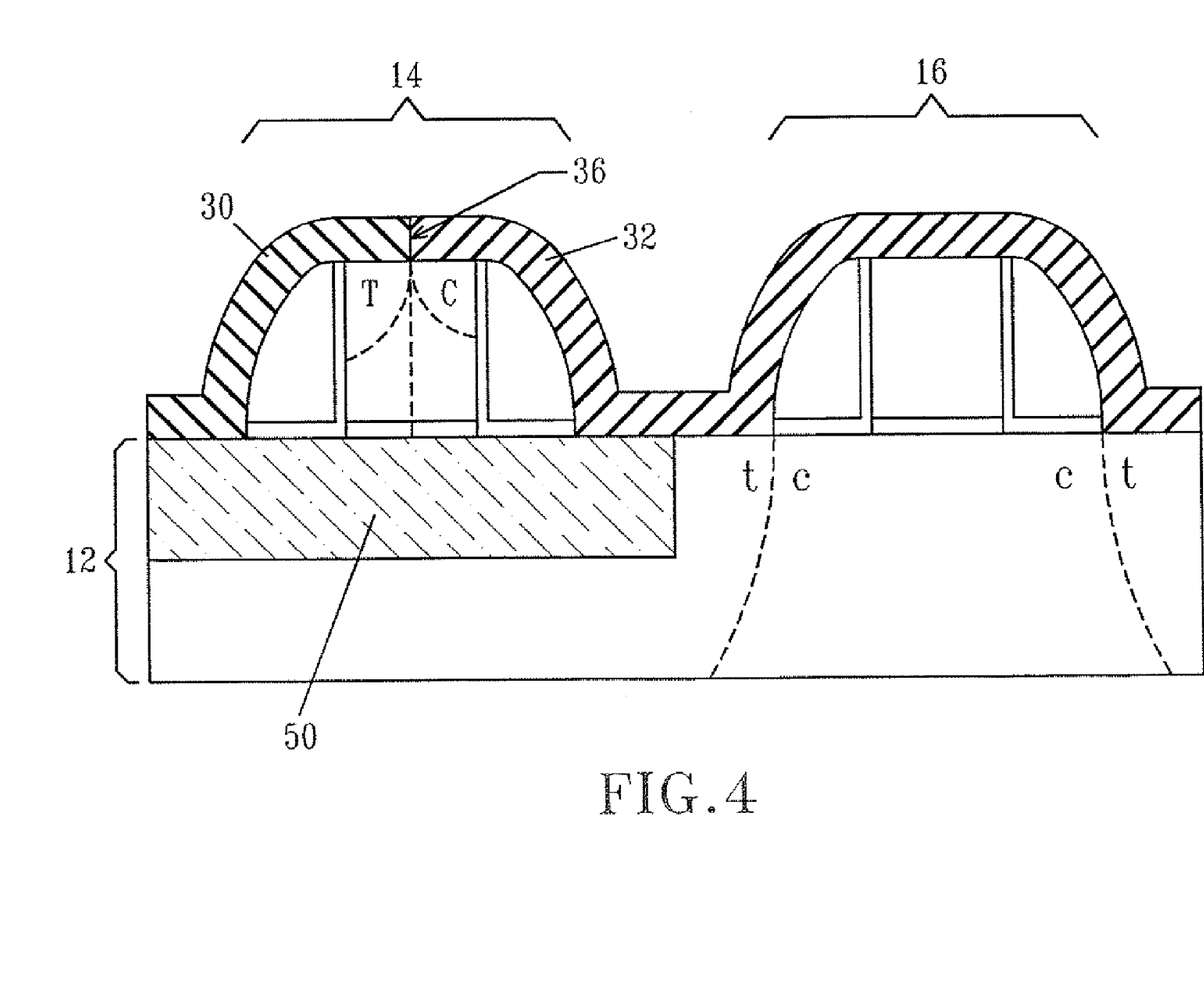
FIG. 4 is a pictorial representation (through a cross sectional view) depicting another alternative structure of the present application.
Figure 5:
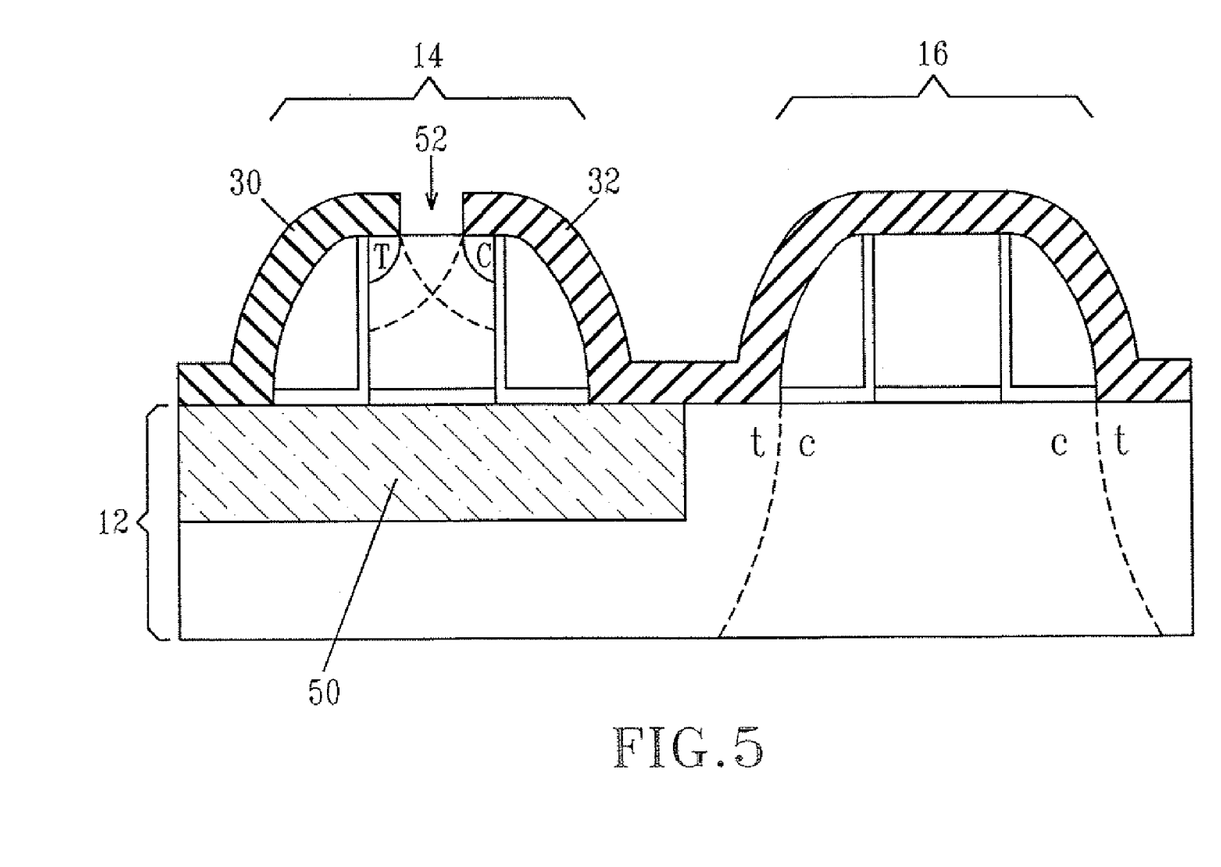
FIG. 5 is a pictorial representation (through a cross sectional view) depicting yet another alternative structure of the present application.

FIG. 3 shows an alternative structure that can be formed by modifying the basic description provided above for FIGS. 2A-2C. In the structure illustrated in FIG. 3 the dummy gate is formed atop an isolation region 50 such as a trench isolation region. The isolation region 50 is formed into the substrate 12 utilizing techniques that are well known to those skilled in the art. For example, a trench isolation region can be formed by first providing a trench into the substrate by lithography and etching, the trench is then filled with a trench dielectric material, typically a trench oxide, and a planarization process is then performed. It is noted that although this structure includes overlapped stress liners atop the dummy gate region, neither the invention nor this embodiment is limited to the same. Instead, the stress liners may be perfectly abutted to each other over the dummy gate region (as shown in FIG. 4) or a gap 52 may be present between the stress liners atop the dummy gate region (as shown in FIG. 5). These alternative structures can of course be used in conjugation with the embodiment depicted in FIGS. 2A-2C.

In addition to the above embodiments and alternative structures, the present invention also contemplates an embodiment wherein one of the stress liners is removed from the structure such that a single stress liner is present in which the single stress liner has an edge that lands atop the dummy gate region. For example, a system in which a tensile stress liner is deposited but removed from a pFET; no compressive liner is used.

As indicated above, the present invention provides a method and semiconductor structure that overcomes the dual stress liner boundary problem, without significantly increasing the overall size of the integrated circuit. This is achieved in the present invention by ensuring that the dual stress liner boundary between tensile and compressive stress liners is forced to land on a neighboring dummy gate region. By forcing the dual stress liner boundary to land on the dummy gate region, the large stresses associated with the dual stress liner boundary are transferred to the dummy gate region, not directly to the semiconductor substrate. Thus, the impact of the dual stress liner boundary on the nearest neighboring FET is reduced. Additionally, benefits of device variability and packing density are achieved utilizing the present invention.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of forming a semiconductor structure comprising:

providing a hybrid semiconductor substrate having surface regions of different crystal orientation, said substrate further having at least one dummy gate region in proximity to at least one active gate region; and disposing a tensile stress liner and then a compressive stress liner on said substrate using chemical vapor deposition including as a precursor a reaction mixture of $C_8H_{22}N_2Si$ and ammonia, wherein said tensile stress liner and said compressive stress liner are present in part over said at least one dummy gate region such that a gap exists between the stress liners that lands on top of said at least one dummy gate region.

* * * * *